(12) United States Patent
Kitamura

(10) Patent No.: US 12,381,650 B2
(45) Date of Patent: Aug. 5, 2025

(54) OPTICAL TRANSMISSION DEVICE, OPTICAL TRANSMISSION SYSTEM, AND OPTICAL TRANSMISSION METHOD

(71) Applicant: NEC Corporation, Tokyo (JP)

(72) Inventor: Takeshi Kitamura, Tokyo (JP)

(73) Assignee: NEC CORPORATION, Tokyo (JP)

( * ) Notice: Subject to any disclaimer, the term of this patent is extended or adjusted under 35 U.S.C. 154(b) by 36 days.

(21) Appl. No.: 18/410,026

(22) Filed: Jan. 11, 2024

(65) Prior Publication Data

US 2024/0250774 A1     Jul. 25, 2024

(30) Foreign Application Priority Data

Jan. 20, 2023   (JP) .................. 2023-007278

(51) Int. Cl.
| | |
|---|---|
| H04L 1/00 | (2006.01) |
| H03M 13/13 | (2006.01) |
| H04B 10/40 | (2013.01) |

(52) U.S. Cl.
CPC .......... H04L 1/0041 (2013.01); H03M 13/13 (2013.01); H04B 10/40 (2013.01); H04L 1/0045 (2013.01)

(58) Field of Classification Search
CPC ... H04L 1/0009; H04L 1/0041; H04L 1/0045; H04B 10/40; H03M 13/13
See application file for complete search history.

(56) References Cited

U.S. PATENT DOCUMENTS

| | | | | |
|---|---|---|---|---|
| 2012/0057873 A1* | 3/2012 | Morkel | .............. | H04B 10/2916 398/79 |
| 2015/0256288 A1* | 9/2015 | Tanaka | .................. | H04L 1/0009 714/776 |
| 2018/0115366 A1* | 4/2018 | Kakande | .............. | H04L 63/062 |

FOREIGN PATENT DOCUMENTS

JP        2018-511252 A      4/2018

* cited by examiner

*Primary Examiner* — Shelly A Chase
(74) *Attorney, Agent, or Firm* — Sughrue Mion, PLLC

(57) ABSTRACT

An optical transmission device includes: a route control unit that outputs user data including destination information to a first channel or a second channel, based on a latency associated with each destination included in the destination information; a first optical transmission unit that treats the user data as first data when the user data are output to the first channel, converts the first data into a first optical signal by first error correction coding processing and a first modulation method, and transmits the first optical signal; and a second optical transmission unit that treats the user data as second data when the user data are output to the second channel, converts the second data into a second optical signal by second error correction coding processing different from the first error correction coding processing, and a second modulation method different from the first modulation method, and transmits the second optical signal.

12 Claims, 16 Drawing Sheets

Fig.3

| DESTINATION INFORMATION (ADDRESS) OF USER DATA | OUTPUT DESTINATION OF USER DATA |
|---|---|
| NW711 | FIRST OPTICAL TRANSMISSION UNIT |
| NW721 | SECOND OPTICAL TRANSMISSION UNIT |

Fig.4

| OPTICAL TRANSMISSION UNIT | CORRECTION CODE RATIO | MODULATION METHOD |
|---|---|---|
| FIRST OPTICAL TRANSMISSION UNIT | 7% | BPSK, QPSK |
| SECOND OPTICAL TRANSMISSION UNIT | 25% | 8QAM, 16QAM |

OPTICAL TRANSMISSION DEVICE, OPTICAL TRANSMISSION SYSTEM, AND OPTICAL TRANSMISSION METHOD

TECHNICAL FIELD

The present disclosure relates to an optical transmission device and the like.

BACKGROUND ART

A technique of performing forward error correction (FEC) processing for detecting and correcting a data error in a transmission path in a long-distance optical fiber transmission system is known. An optical transmission apparatus provided with a function for the FEC processing computes a correction code before modulating data, adds the computed correction code to the data, and transmits the data and the correction code together as an optical signal. An optical reception apparatus provided with a function for FEC processing separates the data and the correction code from a received signal and checks whether there is an error in the data by using the correction code. When there is an error in the transmission data, the optical reception apparatus corrects the data error by using the correction code.

In general, an error rate is high in a long-distance transmission system, and therefore a long correction code having strong error collection capability is used. Thereby, error correction can be executed even when the error rate is high. However, when a long correction code is used, a computation amount required when computing a correction code at a time of transmission and required for error correction at a time of reception increases. Consequently, delay (latency) in data transmission increases. Note that, in the present description, "latency" refers to a time from a start of transmission of data at a transmission source until the data arrives at a transmission destination apparatus. "Latency" in the present description may generally be called "one-way latency". Further, a round trip time (RTT) is a sum of a time for sending data, a time for receiving the data, and a time for processing the data at a transmission destination, and is distinguished from the "latency" in the present description.

In relation to the present disclosure, a system in which transmission paths having different delay times are used together is described in Japanese Unexamined Patent Application Publication (Translation of PCT Application) No. 2018-511252.

SUMMARY

In a service in which real time-performance is required, such as online gaming and financial transaction, connection between a network apparatus providing the service and an apparatus of a user who uses the service (user apparatus) is required to have low latency rather than high transmission rate of data. Meanwhile, in a general optical transmission system, in order to transmit a large amount of data over a long distance in a short time, error tolerance is improved by adding a long correction code to the data in FEC processing. This increases a computation amount for the FEC processing in a transmitter and a receiver, and therefore there is a problem that, even for data for which low latency is required, the FEC processing increases data latency.

An exemplary object of the disclosure is to provide a technique for processing data according to a latency required in transmitting the data.

An optical transmission device according to the present disclosure includes:
  a route control means for outputting user data including destination information to a first channel or a second channel, based on a latency associated with each destination included in the destination information;
  a first optical transmission means for treating the user data as first data when the user data are output to the first channel, converting the first data into a first optical signal by first error correction coding processing and a first modulation method, and transmitting the first optical signal; and
  a second optical transmission means for treating the user data as second data when the user data are output to the second channel, converting the second data into a second optical signal by second error correction coding processing different from the first error correction coding processing, and a second modulation method different from the first modulation method, and transmitting the second optical signal.

An optical transmission system according to the present disclosure includes an optical transmission device and an optical reception device being communicably connected,
  the optical transmission device includes:
    a route control means for outputting user data including destination information to a first channel or a second channel, based on a latency associated with each destination included in the destination information;
    a first optical transmission means for treating the user data as first data when the user data are output to the first channel, converting the first data into a first optical signal by first error correction coding processing and a first modulation method, and transmitting the first optical signal; and
    a second optical transmission means for treating the user data as second data when the user data are output to the second channel, converting the second data into a second optical signal by second error correction coding processing different from the first error correction coding processing, and a second modulation method different from the first modulation method, and transmitting the second optical signal, and
  the optical reception device includes:
    a first optical reception means for demodulating the first data from the first optical signal; and
    a second optical reception means for demodulating the second data from the second optical signal.

An optical transmission method according to the present disclosure includes:
  outputting user data including destination information to a first channel or a second channel, based on a latency associated with each destination included in the destination information;
  treating the user data as first data when the user data are output to the first channel, converting the first data into a first optical signal by first error correction coding processing and a first modulation method, and transmitting the first optical signal; and
  treating the user data as second data when the user data are output to the second channel, converting the second data into a second optical signal by second error correction coding processing different from the first error correction coding processing, and a second modulation method different from the first modulation method, and transmitting the second optical signal.

The present disclosure enables processing data according to a latency being required for transmitting the data.

BRIEF DESCRIPTION OF THE DRAWINGS

Exemplary features and advantages of the present disclosure will become apparent from the following detailed description when taken with the accompanying drawings in which:

FIG. 3 is an example of a route table included in a route control unit;

FIG. 4 is a diagram illustrating an example of signal processing setting;

EXAMPLE EMBODIMENT

Figure 1:
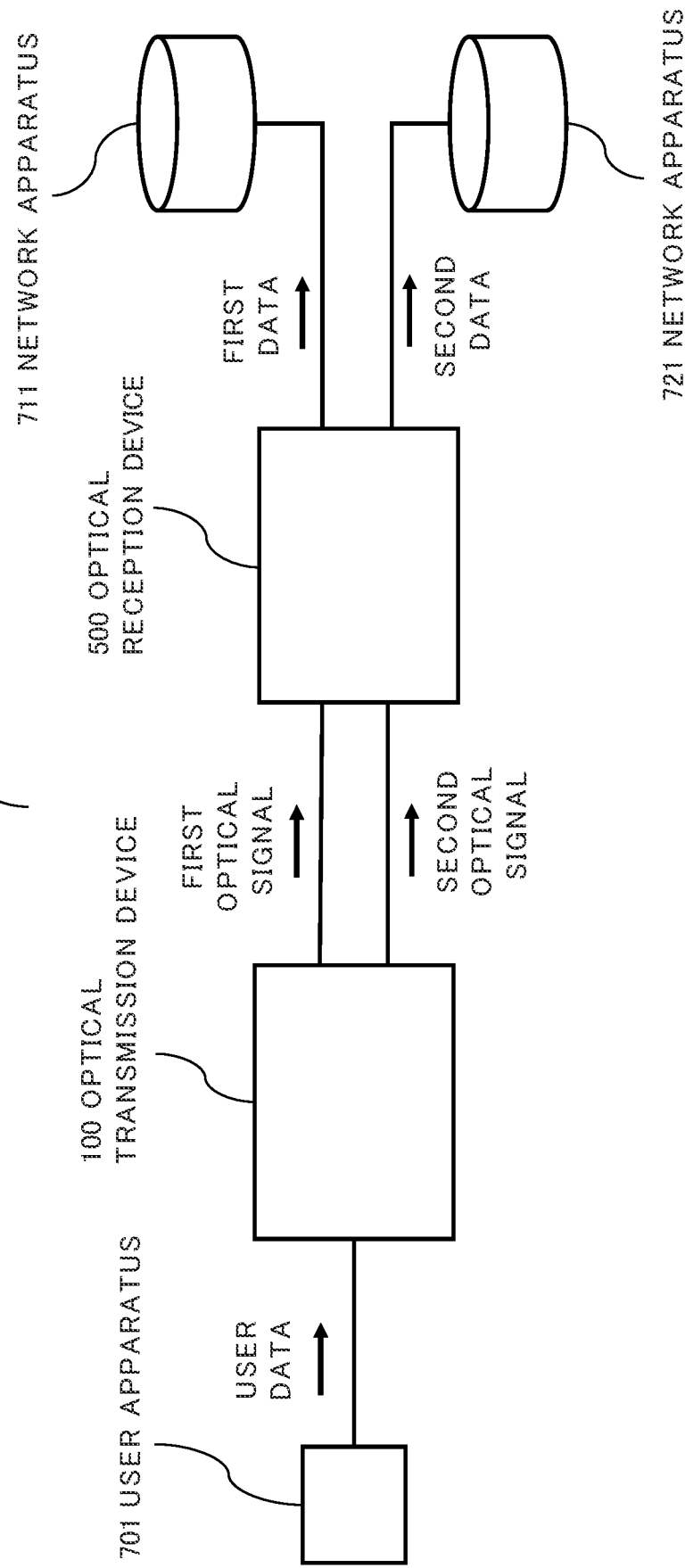
FIG. 1 is a block diagram illustrating a configuration example of an optical transmission system.

In the following, example embodiments of the present disclosure will be described with reference to the drawings. An arrow illustrated in the drawings exemplifies a direction of a signal and the like, and limitation to a property of the signal and the like is not intended. A component that is already-described is denoted with an identical reference sign in each of the example embodiments and the drawings, and overlapping description may be omitted.

First Example Embodiment

FIG. 1 is a block diagram illustrating a configuration example of an optical transmission system 1 according to a first example embodiment. The optical transmission system 1 includes a user apparatus 701, an optical transmission device 100, an optical reception device 500, and network apparatuses 711 and 721. The user apparatus 701 communicates with the network apparatus 711 or the network apparatus 721, depending on an application used. FIG. 1 illustrates a configuration for data transmission in a direction from the user apparatus 701 to the network apparatuses 711 and 721. Illustration of a configuration for data transmission in a direction from the network apparatuses 711 and 721 to the user apparatus 701 is omitted.

The user apparatus 701 transmits user data to the optical transmission device 100. The user data are, for example, data transmitted by using Internet protocol (IP) packets, but are not limited thereto. The user data include an address of the network apparatus 711 or 721 being a destination of the user data. The user data include at least one of first data and second data. The first data are data transmitted from the user apparatus 701 to the network apparatus 711, and a destination of the first data is the network apparatus 711. The second data are data transmitted from the user apparatus 701 to the network apparatus 721, and a destination of the second data is the network apparatus 721. The optical transmission device 100 converts the first data into a first optical signal and converts the second data into a second optical signal. The first optical signal and the second optical signal are transmitted from the optical transmission device 100 to the optical reception device 500. An optical transmission path such as an optical fiber connects the optical transmission device 100 and the optical reception device 500.

The optical reception device 500 is an optical receiver communicably connected to the optical transmission device 100 via the optical transmission path. The optical reception device 500 receives the first optical signal and the second optical signal from the optical transmission device 100. The optical reception device 500 transmits first data demodulated from first optical signal to the network apparatus 711 and transmits second data demodulated from the second optical signal to the network apparatus 721. In this way, the first data transmitted by the user apparatus 701 reach the network apparatus 711 and the second data reach the network apparatus 721.

Each of the network apparatus 711 and the network apparatus 721 is a transmission destination of the user data. The network apparatus 711 is, for example, a server that provides an online game service or a financial transaction service. In communication with the network apparatus 711, a route from the user apparatus 701 to the network apparatus 711 is required to have low latency, in order to transmit a user request at high rate. The network apparatus 721 is, for example, a database. Therefore, in order to register a large amount of data in a short time, a route from the user apparatus 701 to the network apparatus 721 is required to have high transmission rate rather than low latency. Specifically, low latency rather than high transmission rate is required for a route for the first data transmitted to the network apparatus 711 and high transmission rate rather than low latency is required for a route for the second data transmitted to the network apparatus 721.

Figure 2:
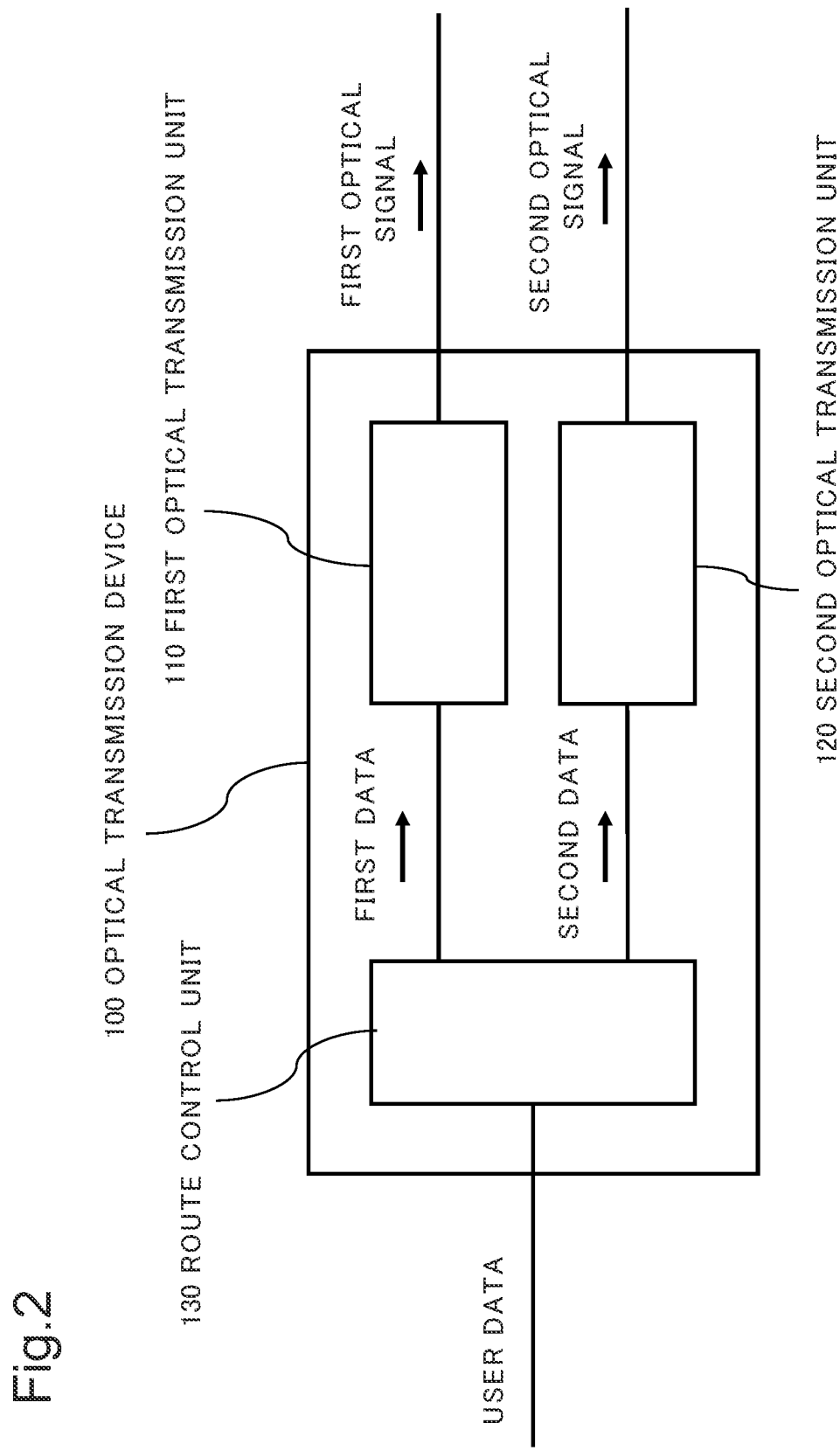
FIG. 2 is a block diagram illustrating a configuration example of an optical transmission device.

FIG. 2 is a block diagram illustrating a configuration example of the optical transmission device 100. The optical transmission device 100 includes a route control unit 130, a first optical transmission unit 110, and a second optical transmission unit 120. The route control unit 130 outputs the user data to the first optical transmission unit 110 or the second optical transmission unit 120, depending on a latency associated with each destination of the user data received from the user apparatus 701. Specifically, the route control unit 130 outputs the first data, which are data requiring low latency, to the first optical transmission unit 110, and outputs the second data, which are data not requiring low latency, to the second optical transmission unit 120.

A route table is stored in the route control unit 130. The route table indicates a final destination of each of the first data and the second data (specifically, the network apparatus 711 or 721). The route control unit 130 refers to the route table and outputs the first data, which are data to be transmitted to the network apparatus 711, to the first optical transmission unit 110. The route control unit 130 further outputs the second data, which are data to be transmitted to the network apparatus 721, to the second optical transmission unit 120.

Note that, in FIG. 1 and FIG. 2, a route through which the first data are transmitted from the route control unit 130 to the network apparatus 711 may be referred to as a first channel. Further, a route through which the second data are transmitted from the route control unit 130 to the network apparatus 712 can be referred to as a second channel.

FIG. 3 illustrates an example of the route table included in the route control unit 130. The route table indicates correspondence between destination information of the user data and an output destination of the user data. The destination information of the user data is, for example, an address of a network apparatus being a destination. In FIG. 3, it is indicated that an address of the network apparatus 711 is "NW711" and an address of the network apparatus 721 is "NW721". A format of the address may be any format that can be processed by the optical transmission system 1. These addresses are included in the user data. When the destination of the user data input to the route control unit 130 is the network apparatus 711, the route control unit 130 outputs the data to the first optical transmission unit 110, as the first data. Further, when the destination of the user data input to the route control unit 130 is the network apparatus 721, the route control unit 130 outputs the data to the second optical transmission unit 120, as the second data. Note that, the route table in FIG. 3 is an example and the route control unit 130 may select the output destination of the user data by following another procedure. For example, the route control unit 130 may output only the user data of which destination is the network apparatus 711 to the first optical transmission unit 110 as the first data, and may output other user data to the second optical transmission unit 120 as the second data. Conversely, the route control unit 130 may output only the user data of which destination is the network apparatus 721 to the second optical transmission unit 120 as the second data, and may output other user data to the first optical transmission unit 110 as the first data.

As described above, the route control unit 130 includes the route table that indicates which of the first optical transmission unit 110 and the second optical transmission unit 120 processes the addresses of the network apparatuses 711 and 721 being destinations of the user data input from the user apparatus 701. Further, the route control unit 130 allocates the user data to the first optical transmission unit 110 or the second optical transmission unit 120, depending on the destination. Note that, the route table may be preliminarily registered in the route control unit 130. Further, the route table may be rewritten according to an instruction from the network apparatus 711 or the 721. For example, the network apparatus 711 or the 721 may be provided with a function of accessing the route control unit 130. Further, the network apparatus 711 or 721 may be provided with a function of setting the route table in such a way that the own device is set to be the destination of the user data that can be processed by each of the network apparatuses 711 and 721.

The first optical transmission unit 110 and the second optical transmission unit 120 add a correction code for FEC to the input user data and convert the user data added with the correction code into an optical signal. Specifically, the first optical transmission unit 110 adds a relatively short correction code to the first data, in order to ensure that the first data are transmitted with low latency. Then, the first optical transmission unit 110 generates, by using a first modulation method of which transmission rate is relatively low, a first optical signal from the first data added with the correction code. The second optical transmission unit 120 adds a correction code that is longer than the correction code added by the first optical transmission unit 110, to the second data. Herein, the error correction coding processing in the first optical transmission unit 110 may be referred to as first error correction coding processing. Further the error correction coding processing in the second optical transmission unit 120 may be referred to as second error correction coding processing.

Since the longer the correction code, the better error correction capability, a second modulation method having a transmission rate higher than that of the first modulation method may be employed for modulation of the second data. Thus, the second optical transmission unit 120 generates the second optical signal by using a modulation method of which transmission rate is higher than that of the modulation method used in the first optical transmission unit 110.

In other words, a length of the correction code added to the first data in the first error correction coding processing is less than a length of the correction code added to the second data in the second error correction coding processing. Further, a transmission rate of the first data modulated with the first modulation method is less than a transmission rate of the second data modulated with the second modulation method.

FIG. 4 is a diagram illustrating an example of signal processing setting in the first optical transmission unit 110 and the second optical transmission unit 120. The signal processing setting in FIG. 4 indicates a combination of a correction code ratio and a modulation method. "CORRECTION CODE RATIO" in FIG. 4 is a percentage of the correction codes in the first data and the second data. Specifically, when data before FEC processing are k bits and a correction code added in the FEC processing is m bits, a correction code ratio is acquired as 100×m/(k+m) (%). Each of k and m is a natural number. The first optical transmission unit 110 sets the correction code to a relatively small value (7%) in or der to ensure that the first data are transmitted with low latency, and thereby reduces a computation amount for FEC processing. Further, as the modulation method, BPSK or QPSK in which an error is less likely to occur is employed. BPSK is an abbreviation for binary phase shift keying and QPSK is an abbreviation for quadrature phase shift keying. Meanwhile, the second optical transmission unit 120 performs FEC processing with a correction code ratio of 25%. By setting the correction code ratio higher than that in the first optical transmission unit 110, a stronger error correction capability can be acquired. Thus, in the second optical transmission unit 120, a modulation method faster than BPSK and QPSK, such as 8 QAM and 16 QAM, can be employed as a modulation method. The first optical transmission unit 110 and the second optical transmission unit 120 are set in such a way to operate in accordance with the signal processing setting illustrated in FIG. 4.

Figure 5:
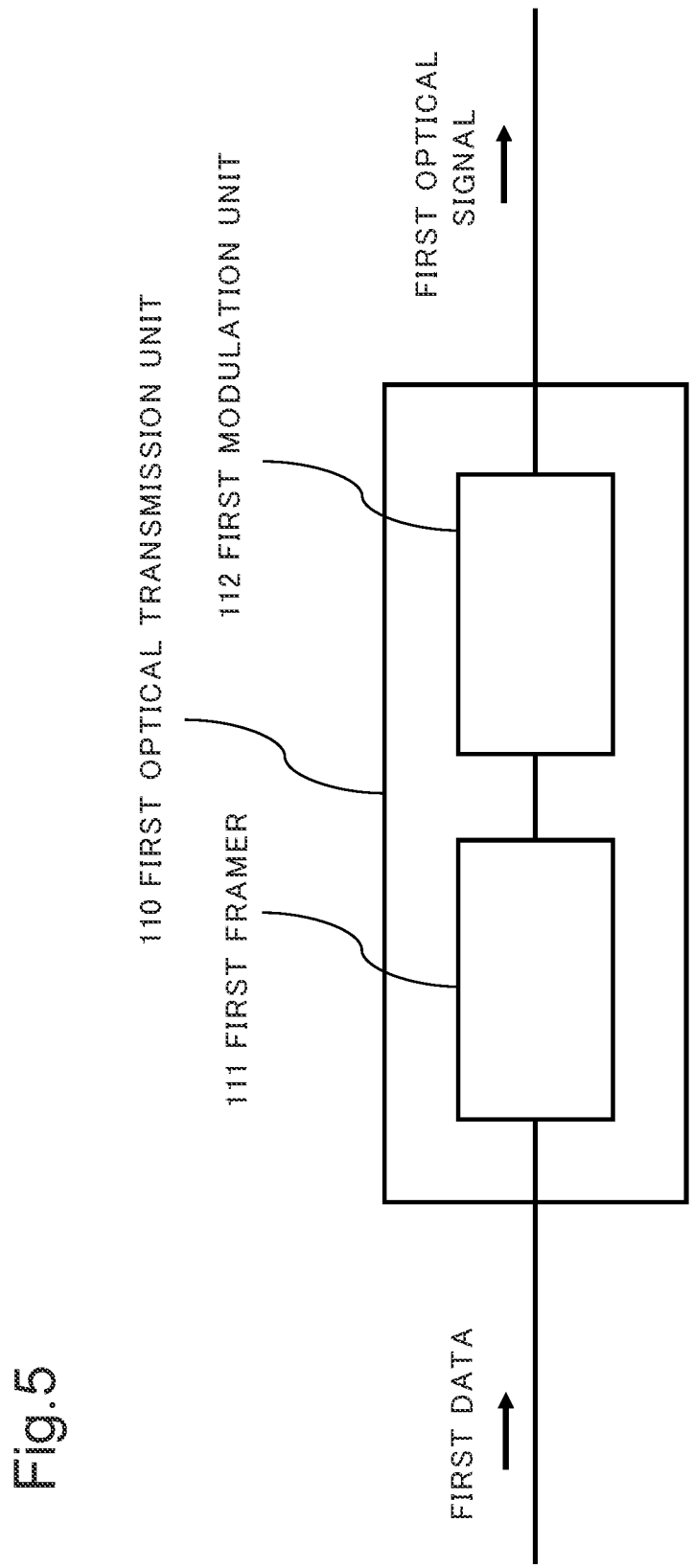
FIG. 5 is a block diagram illustrating a configuration example of a first optical transmission unit.

FIG. 5 is a block diagram illustrating a configuration example of the first optical transmission unit 110. The first optical transmission unit 110 includes a first framer 111 and a first modulation unit 112. The first framer 111 performs FEC processing. Specifically, the first framer 111 adds a correction code to the input first data. An example of a correction code ratio is described in FIG. 4. The first modulation unit 112 includes a light source for generating an optical carrier having a predetermined wavelength, and an optical modulator. The first modulation unit 112 modulates the optical carrier output from the light source, by using the first data added with the correction code, and outputs the modulated optical carrier as the first optical signal. The light source may be external to the first modulation unit 112.

Figure 6:
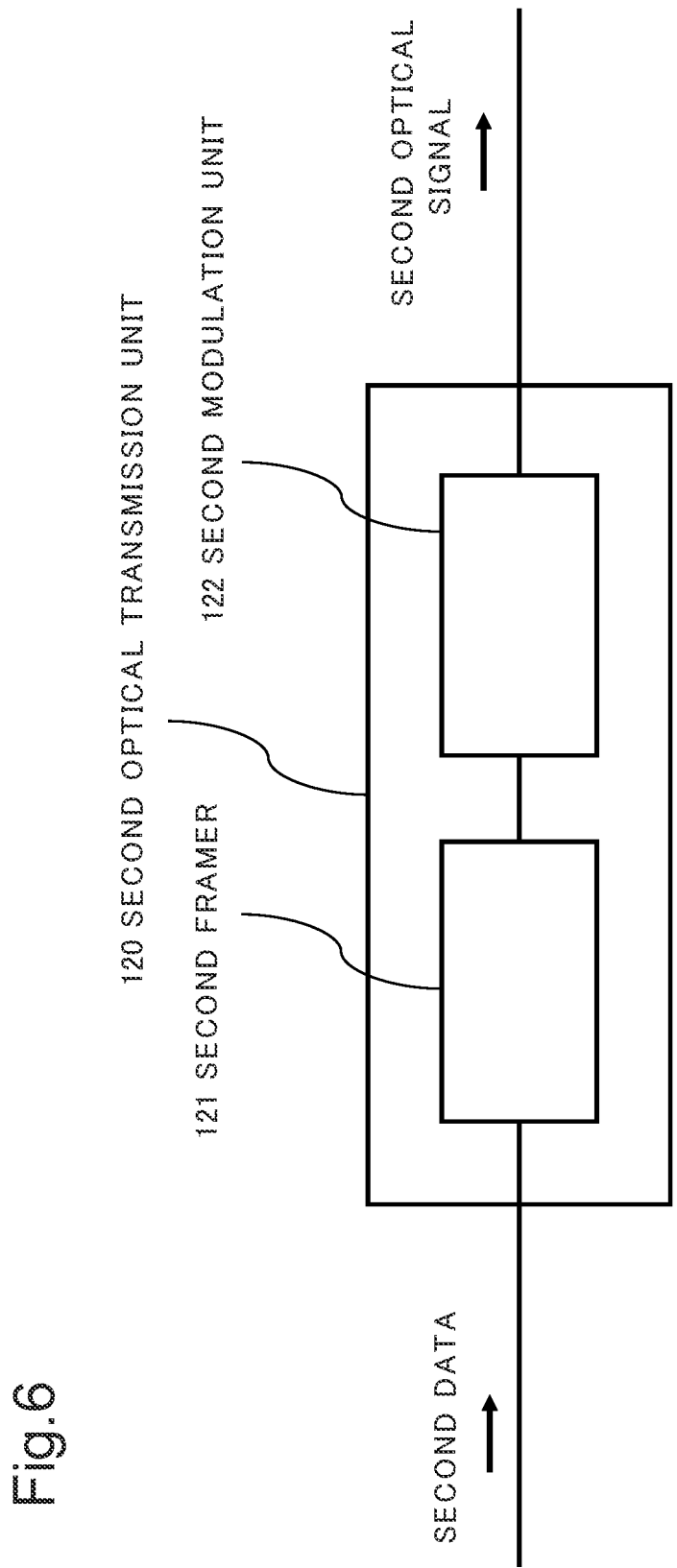
FIG. 6 is a block diagram illustrating a configuration example of a second optical transmission unit.

FIG. 6 is a block diagram illustrating a configuration example of the second optical transmission unit 120. A configuration of the second optical transmission unit 120 is based on the first optical transmission unit 110. Specifically, the second optical transmission unit 120 includes a second framer 121 and a second modulation unit 122. The second framer 121 adds a correction code having the ratio exemplified in FIG. 4 to the input second data. The second modulation unit 122 modulates an optical carrier output from a light source included in the second modification unit 122, by using the second data added with the correction code. Then, the second modulation unit 122 outputs the modulated optical carrier, as the second optical signal.

The first modulation unit 112 and the second modulation unit 122 may be respectively referred to as a first modulation means and a second modulation means. Further, a modulation method set for the first optical transmission unit 110 may be referred to as the first modulation method and a modulation method set for the second optical transmission unit 120 may be referred to as the second modulation method. Specifically, the first modulation means outputs the first optical signal modulated with the first modulation method. The second modulation means outputs the second optical signal modulated with the second modulation method.

Figure 7:
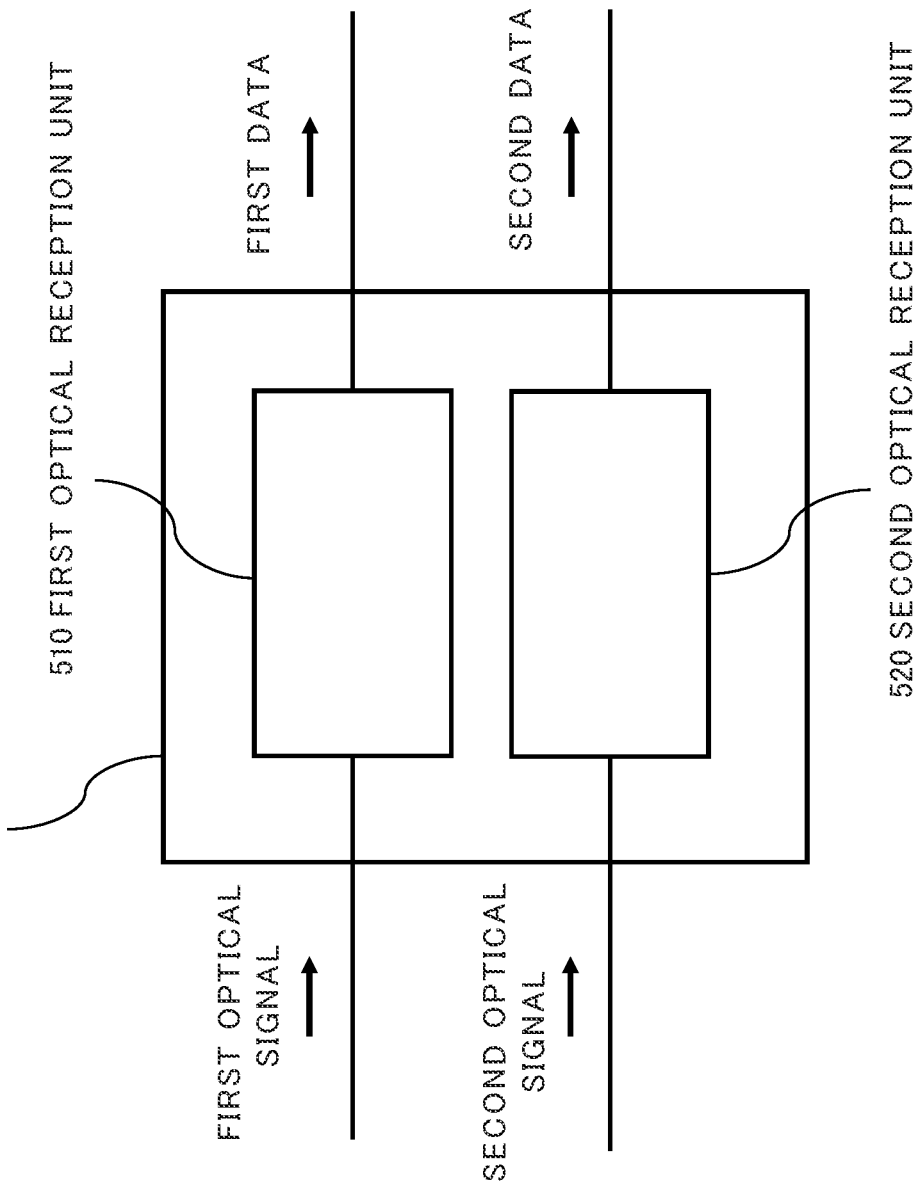
FIG. 7 is a block diagram illustrating a configuration example of an optical reception device.

FIG. 7 is a block diagram illustrating a configuration example of an optical reception device 500 according to the first example embodiment. The optical reception device 500 includes a first optical reception unit 510 and a second optical reception unit 520. The first optical reception unit 510 receives the first optical signal transmitted by the first optical transmission unit 110. Further, the first optical reception unit 510 demodulates the first data from the received first optical signal. The demodulated first data are transmitted to the network apparatus 711. Likewise, the second optical reception unit 520 receives the second optical signal transmitted from the second optical transmission unit 120. Further, the second optical reception unit 520 demodulates the second data from the received second optical signal. The demodulated second data are transmitted to the network apparatus 721. In this way, the first and second optical signals transmitted by the optical transmission device 100 are separately demodulated in the optical reception device 500. Further, the demodulated first and second data are transmitted to the network apparatus 711 or 721, which is the destination of each of the first and second data.

Specifically, the optical reception device 500 includes a first optical reception means and a second optical reception means. The first optical reception means demodulates the first data from the first optical signal. The second optical reception means demodulates the second data from the second optical signal.

Figure 8:
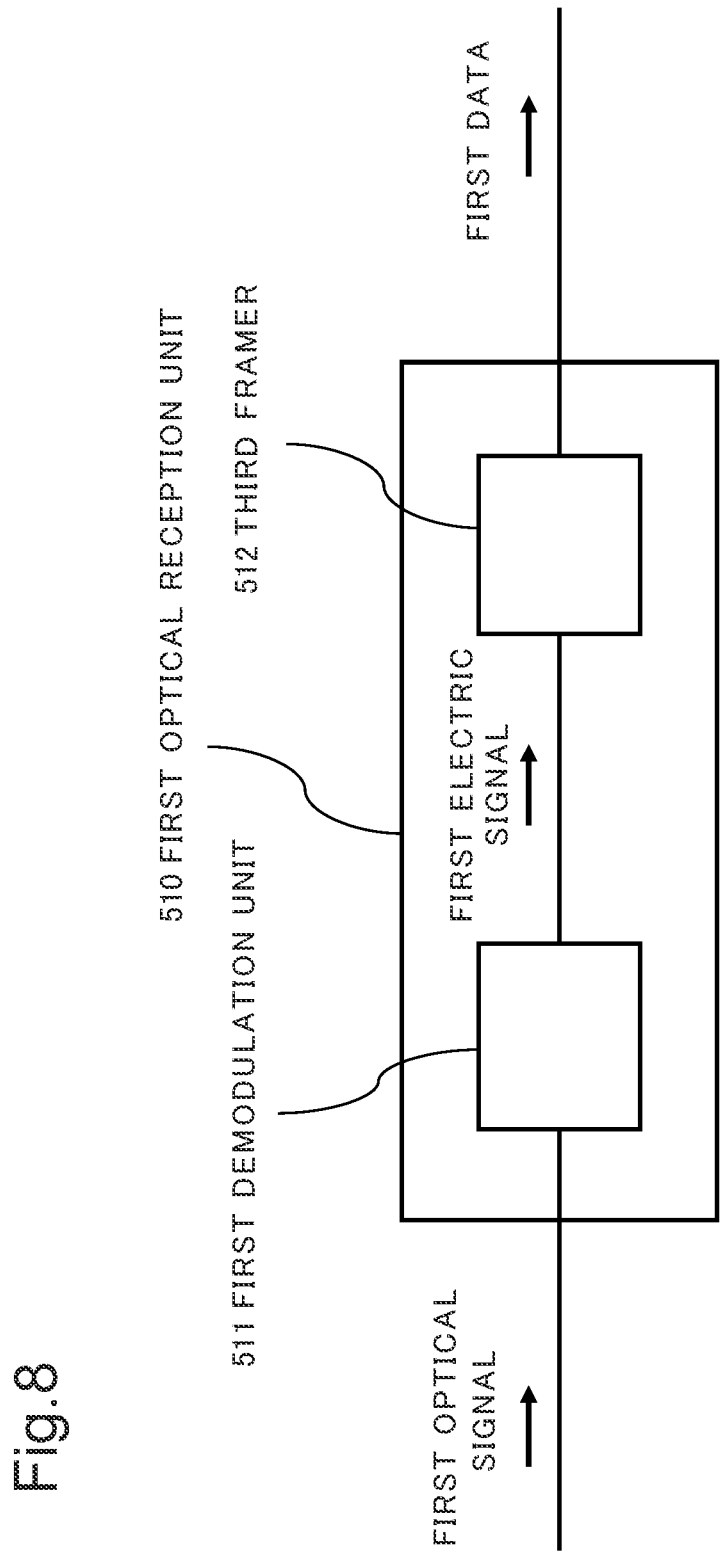
FIG. 8 is a block diagram illustrating a configuration example of a first optical reception unit.

FIG. 8 is a block diagram illustrating a configuration example of the first optical reception unit 510. The first optical reception unit 510 includes a first demodulation unit 511 and a third framer 512. The first demodulation unit 511 converts the first optical signal into a first electric signal. The third framer 512 performs error correction processing on the electrical signal output from the first demodulation unit 511 and outputs the first data. Specifications for error correction in the third framer 512 are preliminarily set in such a way that the correction code generated in the first framer 111 can be processed. The second optical reception unit 520 has a similar configuration as the first optical reception unit 510.

Figure 9:
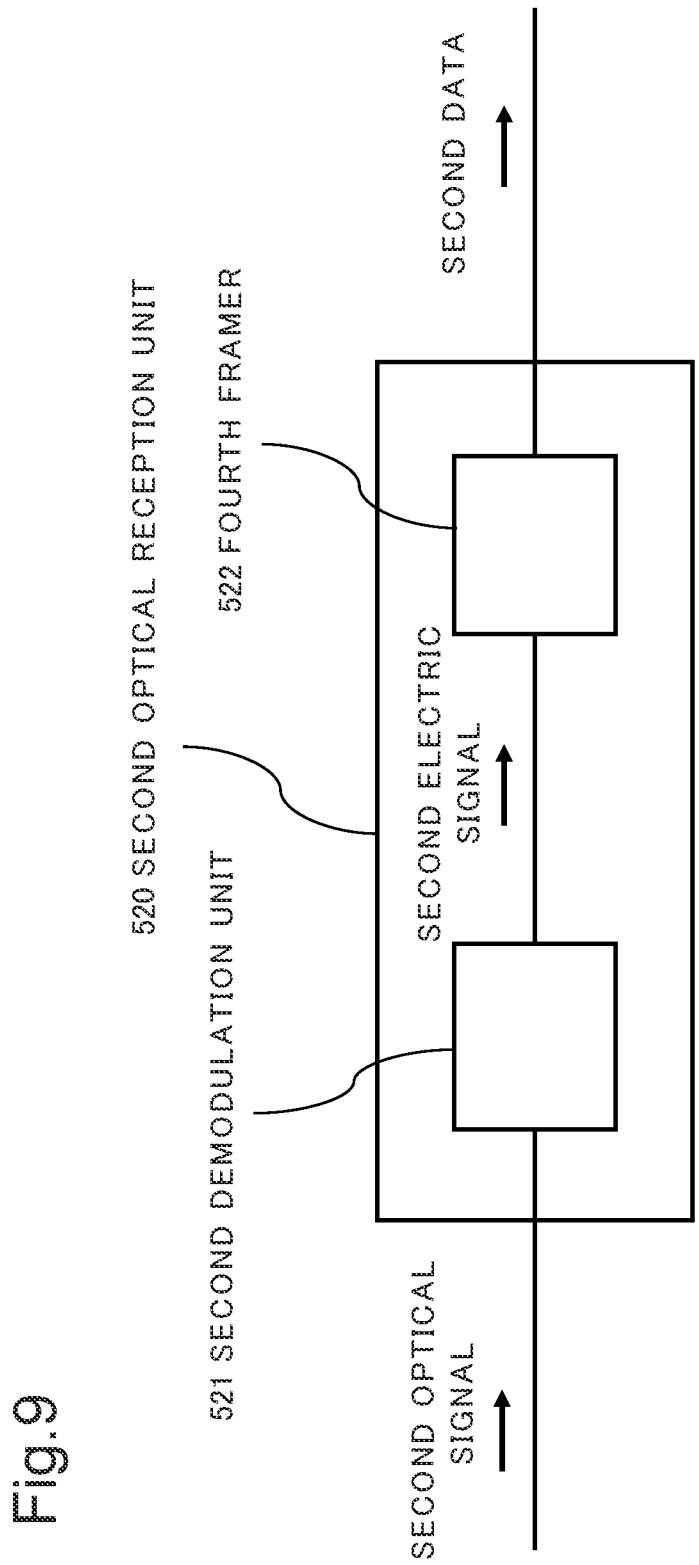
FIG. 9 is a block diagram illustrating a configuration example of a second optical reception unit.

FIG. 9 is a block diagram illustrating a configuration example of the second optical reception unit 520. A configuration, and a function for the second optical signal, of the second optical reception unit 520 are based on the first optical reception unit 510. Specifically, the second optical reception unit 520 includes a second demodulation unit 521 and a fourth framer 522. The second demodulation unit 521 converts the second optical signal into a second electric signal. The fourth framer 522 performs error correction processing on the electric signal output from the second demodulation unit 521 and outputs the second data. Similar to the first optical reception unit 510, specifications for error correction in the fourth framer 522 are preliminarily set in such a way that the correction code generated in the second framer 121 can be processed. The first demodulation unit 511 and the second demodulation unit 521 are a form of the first demodulation means and the second demodulation means, respectively.

As illustrated in FIG. 4, the first optical signal transmitted by the first optical transmission unit 110 has relatively low transmission rate, and also has a relatively small correction code ratio. Thus, a load on the first optical reception unit 510 for FEC processing is light, but the first data can be demodulated in a short time. Further, in comparison with the first optical signal, the second optical signal transmitted by the second optical transmission unit 120 has a higher correction code ratio, but also has a higher transmission rate. Therefore, the second optical reception unit 520 can demodulate a large amount of second data with a low error rate.

As described above, the optical transmission device 100 includes the first optical transmission unit 110 and the second optical transmission unit 120. The first optical transmission unit 110 achieves low-latency communication by shortening the correction code. The second optical transmission unit 120 achieves a high transmission rate by using a high-speed modulation method. Further, when the user data are transmitted from the user apparatus 701 to the network apparatus 711 or 721, the user data can be processed according to latency required for the user data, by setting the route table for the route control unit 130.

In this way, the optical transmission device 100 and the optical transmission system 1 can transmit the user data transmitted by the user apparatus 701 to each destination apparatus. Further, FEC coding and a modulation method suitable for a required latency or transmission rate can be selected according to a destination of the user data. Specifically, the optical transmission system 1 can process data according to a latency required in transmitting the data.

(Minimum Configuration of Optical Transmission Device 100)

In the optical transmission device 100, Each of the first optical transmission unit 110 and the second optical transmission unit 120 is a form of an optical transmission means. Further, the route control unit 130 is a form of a route control means. Further, the FEC processing executed in the optical transmission device 100 is a form of the error correction coding processing.

Thus, the optical transmission device 100 according to the first example embodiment can be described as follows, using reference signs in FIG. 2 in parentheses. Specifically, the optical transmission device (100) with a minimum configuration includes a route control means (130), a first optical transmission means (110), and a second optical transmission means (120). The route control means (130) outputs user data including destination information to the first channel or the second channel, based on a latency associated with each destination included in the destination information.

When the user data are output to the first channel, the first optical transmission means (110) treats the user data as first data. Further, the first optical transmission means (110) converts the first data into a first optical signal through the first error correction coding processing, by using the first modulation method, and transmits the first optical signal. When the user data are output to the second cannel, the second optical transmission means (120) treats the user data as second data. Further, the second optical transmission means (120) converts the second data into a second optical signal through the second error correction coding processing different from the first error correction coding processing, by using the second modulation method different from the first modulation method, and transmits the second optical signal.

The optical transmission device (100) with the minimum configuration can also process data according to a latency required in transmitting the data. A reason for this is that the optical transmission device (100) with the minimum configuration treats the input user data as the first data or the second data, based on the destination information, and modulates each of the first data and the second data through different error correction coding processing, by using a different modulation method.

First Modification Example of First Example Embodiment

Figure 10:
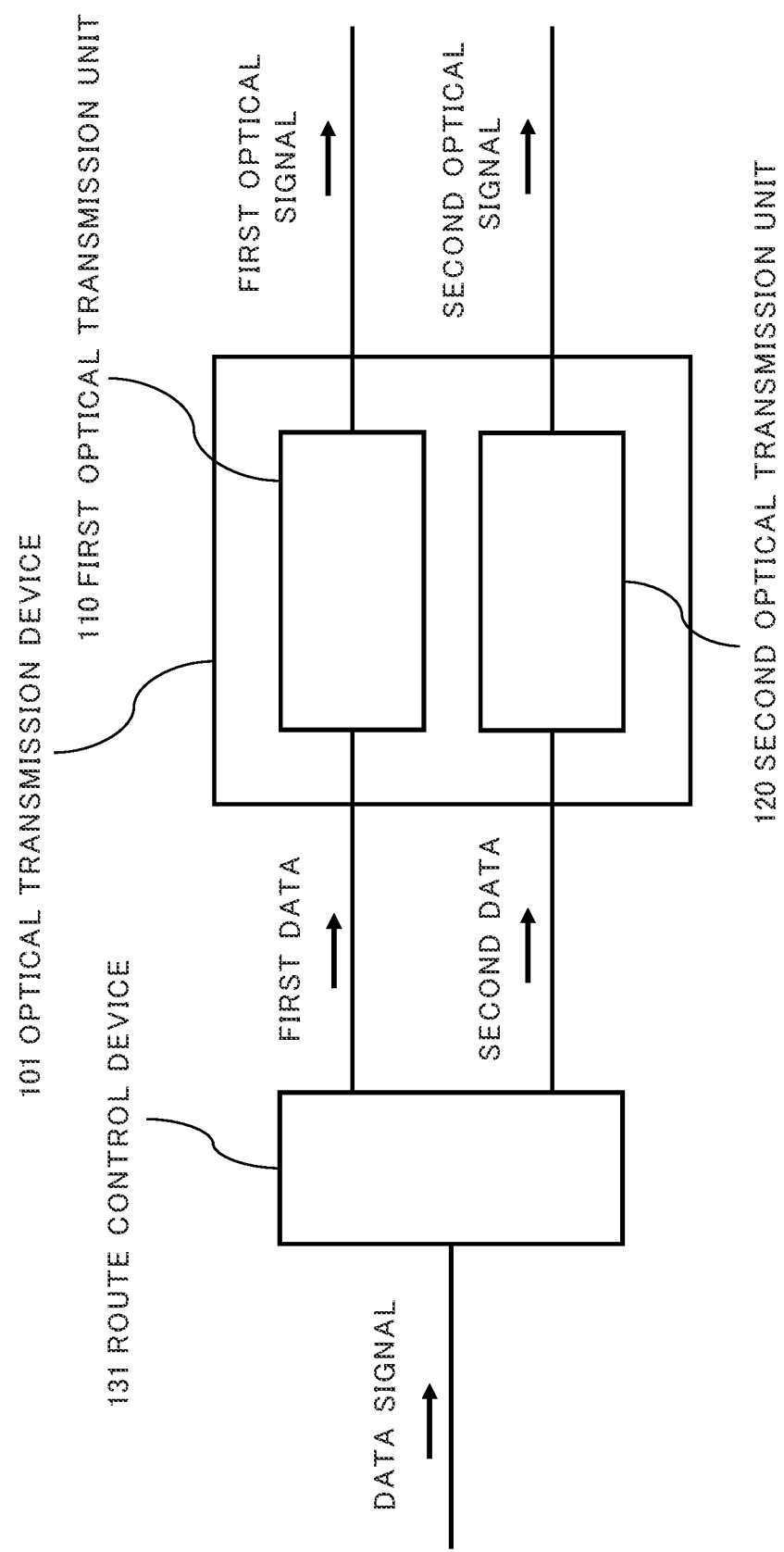
FIG. 10 is a block diagram illustrating a modification example of the optical transmission device.

FIG. 10 is a diagram illustrating an optical transmission system 300, which is a modification example of the optical transmission device 100. The optical transmission system 300 includes an optical transmission device 101 and a route control device 131. The optical transmission system 300 is a system in which the route control unit 130 included in the optical transmission device 100 is disposed outside the optical transmission device 100, as the route control device 131. A function of the route control device 131 is similar to that of the route control unit 130. Therefore, in the present example embodiment, a similar advantageous effect can also be achieved by using the optical transmission system 300 instead of the optical transmission device 100. Further, by applying the route table exemplified in FIG. 3 to an already-installed communication apparatus such as a router, the function of the route control device 131 may be provided to the already-installed communication apparatus. The optical transmission system 300 configured in this way can also achieve an advantageous effect similar to that of the optical transmission device 100.

Second Modification Example of First Example Embodiment

Figure 11:
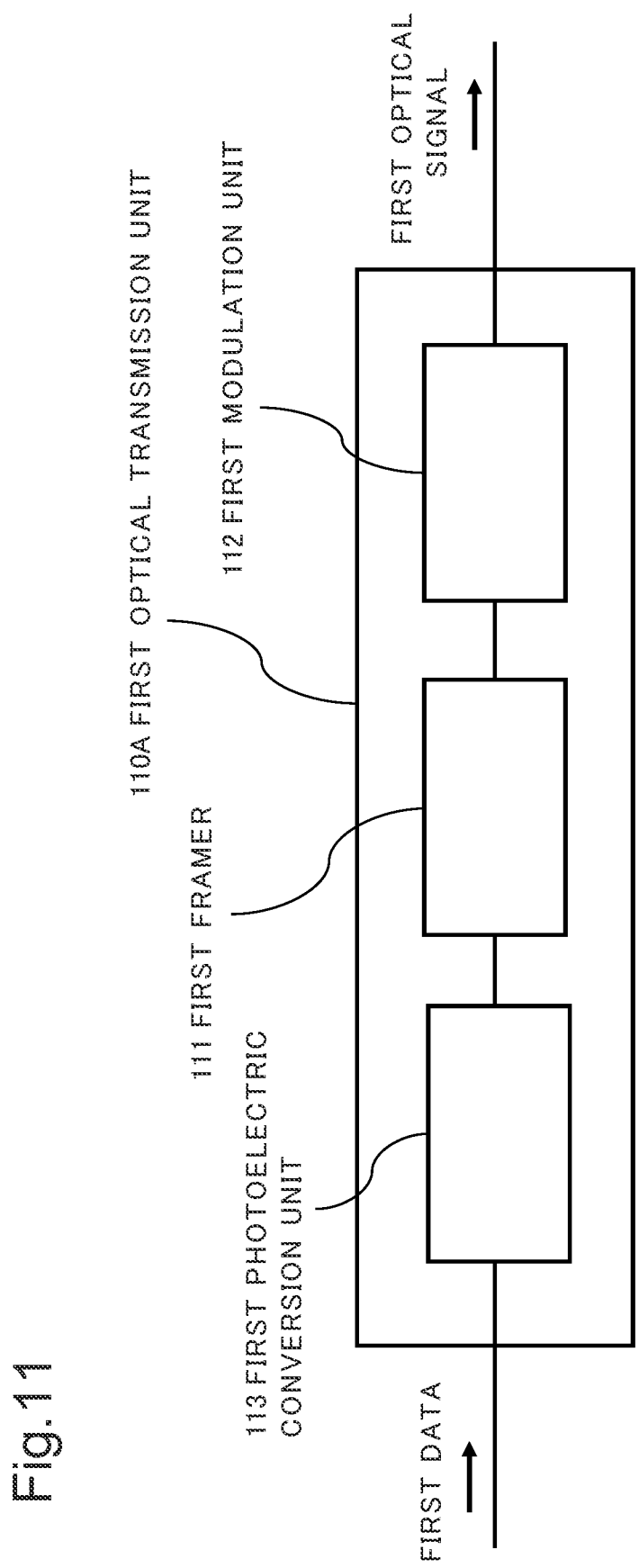
FIG. 11 is a block diagram illustrating a modification example of the first optical transmission unit.
Figure 12:
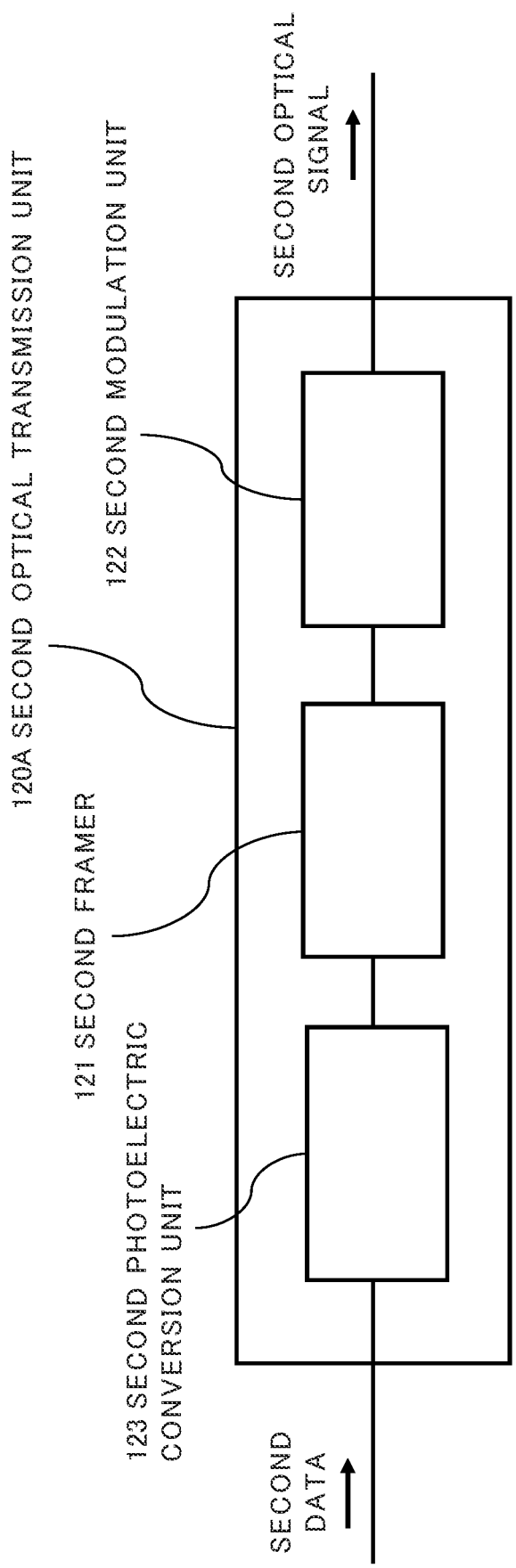
FIG. 12 is a block diagram illustrating a modification example of the second optical transmission unit.

FIG. 11 is a block diagram illustrating a configuration example of a first optical transmission unit 110A, which is a modification example of the first optical transmission unit 110. The first optical transmission unit 110A has a configuration in which a first photoelectric conversion unit 113 is added to the first optical transmission unit 110. For example, when the route control device 131 in FIG. 10 outputs the first data as an optical signal to the optical transmission device 101, the first optical transmission unit 110A can be used instead of the first optical transmission unit 110. Further, a second optical transmission unit 120A illustrated in FIG. 12 also has a configuration in which a second photoelectric conversion unit 123 is added to the second optical transmission unit 120. Thus, for example, when the route control device 131 in FIG. 10 outputs the second data as an optical signal to the optical transmission device 101, the second optical transmission unit 120A can be used instead of the second optical transmission unit 120. The first photoelectric conversion unit 113 and the second photoelectric conversion unit 123 are respectively a form of a first photoelectric conversion means and a form of a second photoelectric conversion means. The first photoelectric conversion means converts the first data into an electric signal and outputs the electric signal to the first framer 111. The second photoelectric means converts the second data into an electric signal and outputs the electric signal to the second framer 121.

In the present example embodiment, the optical transmission system 1 in which the optical transmission device 100 and the optical reception device 500 are in opposition to each other is described. However, the configuration of the optical transmission system 1 according to the present example embodiment can also be applied to a bidirectional optical transmission system in which optical transmission/reception devices are in opposition to each other. In this case, the first optical transmission unit 110, the second optical transmission unit 120, and the first optical reception unit 510 and the second optical reception unit 520 may all be replaced by optical transponders (optical transceivers). In such a configuration, reduction in latency from the user apparatus 701 to the network apparatus 711 enables reduction in a round trip time (RTT) between the user apparatus 701 to the network apparatus 711.

Second Example Embodiment

Figure 13:
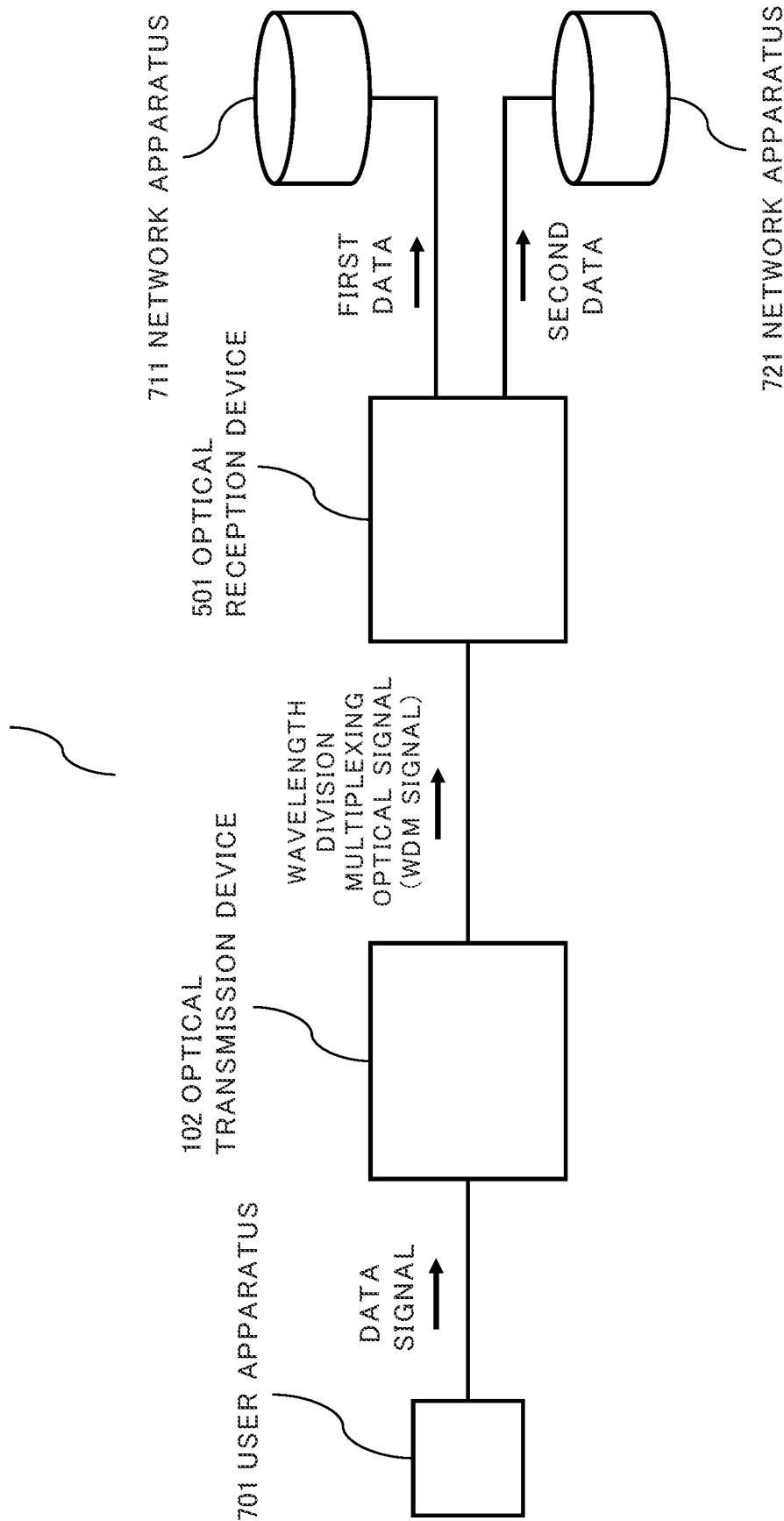
FIG. 13 is a block diagram illustrating a configuration example of an optical transmission system.

FIG. 13 is a block diagram illustrating a configuration example of an optical transmission system 2 according to a second example embodiment of the present disclosure. In comparison with the optical transmission system 1 according to the first example embodiment, the optical transmission system 2 includes an optical transmission device 102 and an optical reception device 501. The optical transmission device 102 is used instead of the optical transmission device 100 and the optical reception device 501 is used instead of the optical reception device 500. In the optical transmission system 2, a wavelength-multiplexed optical signal is transmitted between the optical transmission device 102 and the optical reception device 501. Therefore, in the optical transmission device 102, a wavelength of a first optical signal (first wavelength) and a wavelength of a second optical signal (second wavelength) are different from each other. Hereinafter, the wavelength-multiplexed optical signal is referred to as a wavelength division multiplexing (WDM) signal. The WDM signal is an optical signal in which the first optical signal and the second optical signal are wavelength-multiplexed.

Figure 14:
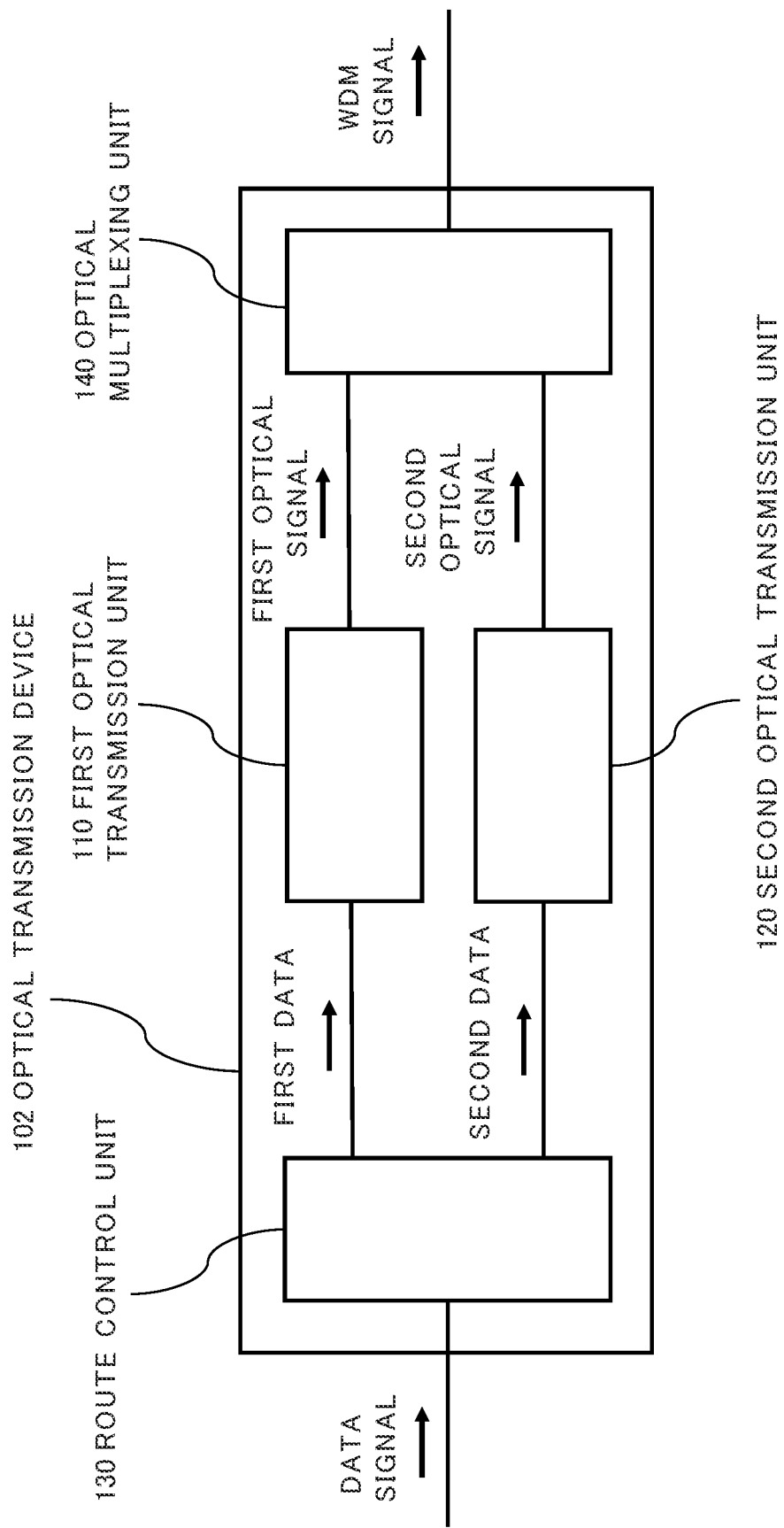
FIG. 14 is a block diagram illustrating a configuration example of an optical transmission device.

FIG. 14 is a block diagram illustrating a configuration example of the optical transmission device 102 according to the present example embodiment. The optical transmission device 102 has a configuration in which an optical multiplexing unit 140 is added to the optical transmission device 100 illustrated in FIG. 2. The optical multiplexing unit 140 wavelength-multiplexes the first optical signal and the second optical signal, for example, by using a dielectric multilayer filter. The first optical signal and the second optical signal are transmitted from the optical transmission device 102 to the optical reception device 501, as the WDM signal. The optical multiplexing unit 140 is one example of an optical multiplexing means used for wavelength-multiplexing optical signals of which wavelengths are different.

Figure 15:
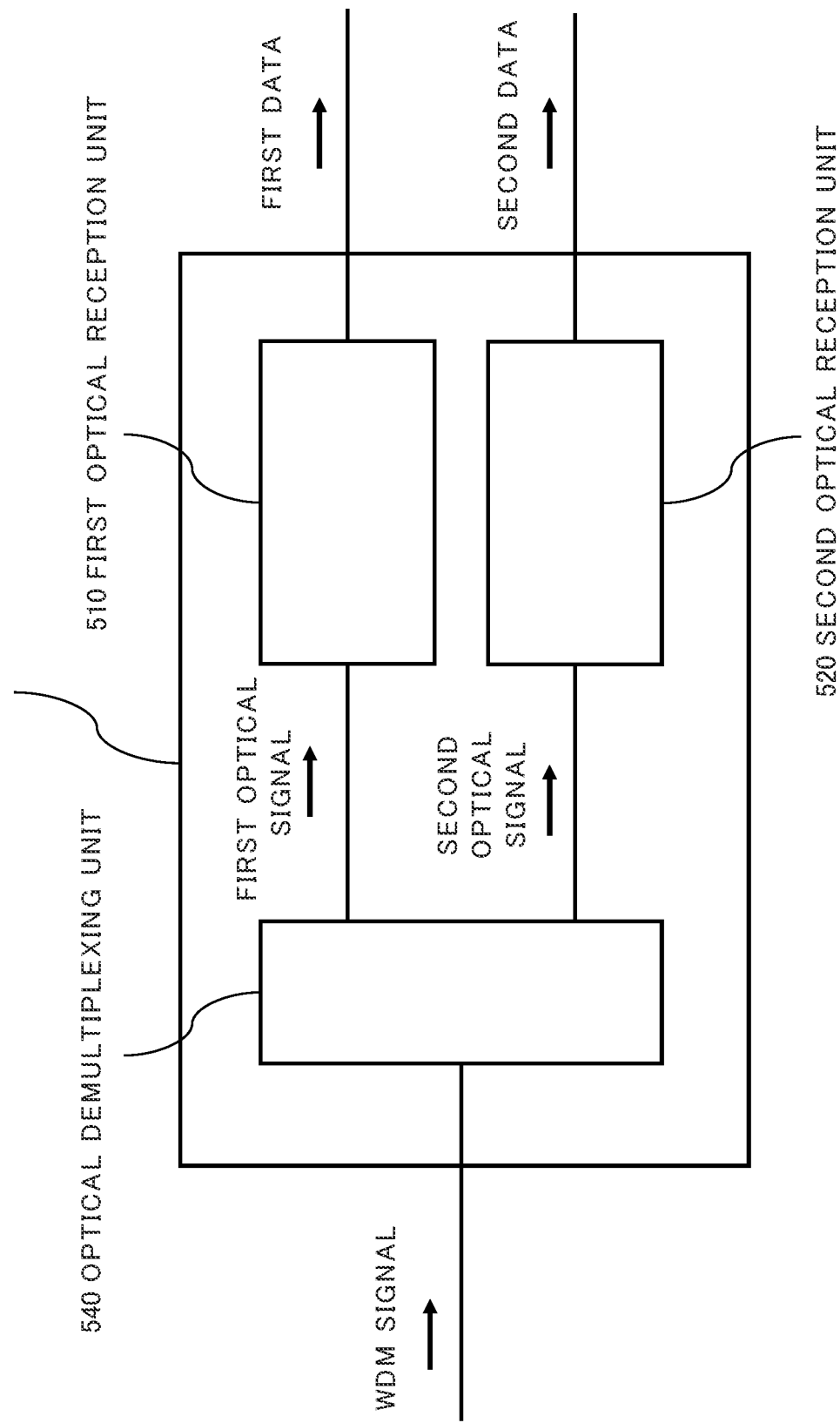
FIG. 15 is a block diagram illustrating a configuration example of an optical reception device.

FIG. 15 is a block diagram illustrating a configuration example of the optical reception device 501. The optical reception device 501 has a configuration in which an optical demultiplexing unit 540 is added to the optical reception device 500 illustrated in FIG. 7. The optical demultiplexing unit 540 wavelength-demultiplexes the WDM signal into the first optical signal and the second optical signal, for example, by using a dielectric multilayer filter. The wavelength-demultiplexed first optical signal is input to a first optical reception unit 510 and the second optical signal is input to a second optical reception unit 520. The first optical reception unit 510 demodulates the first data. The demodulated first data are transmitted to the network apparatus 711. Likewise, the second optical reception unit 520 demodulates the second data. The demodulated second data are transmitted to the network apparatus 721. In this way, the first and second optical signals transmitted by the optical transmission device 102 are demodulated in the optical reception device 501 by following a procedure similar to that in the optical reception device 500. Then, the demultiplexed first data are transmitted to the network apparatus 711 being its destination. Further, the demultiplexed second data are transmitted to the network apparatus 721 being its destination.

Similar to the optical transmission device 100 and optical transmission system 1 according to the first example embodiment, the optical transmission device 102 and the optical transmission system 2 having such configurations can also process data according to a latency required in transmitting the data.

Modification Example of Second Example Embodiment

Figure 16:
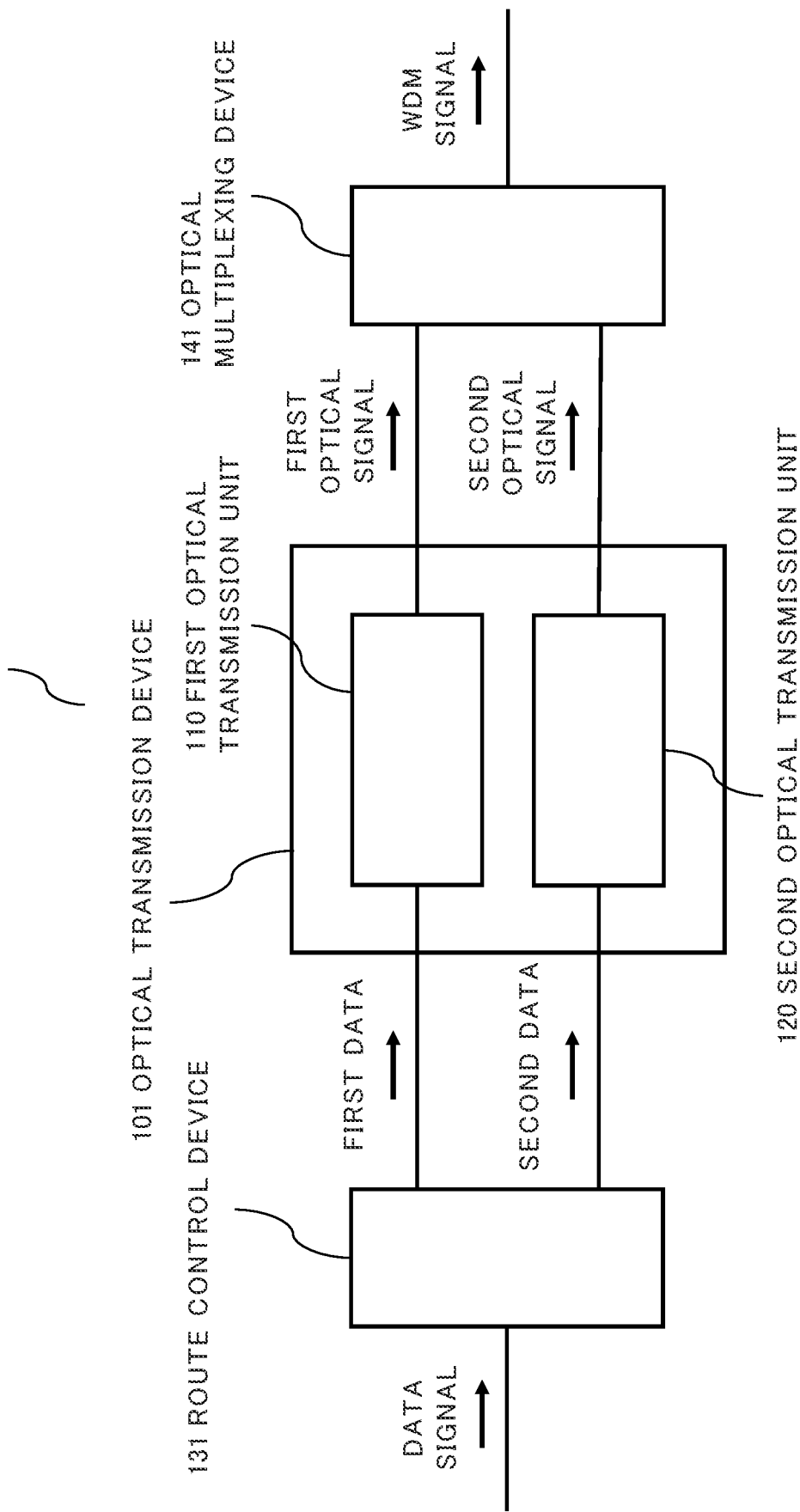
FIG. 16 is a block diagram illustrating an optical transmission system being a modification example of the optical transmission device.

FIG. 16 is a block diagram illustrating an optical transmission system 301, which is a modification example of the optical transmission device 102. The optical transmission system 301 includes an optical transmission device 101, a route control device 131, and an optical multiplexing device 141. The optical transmission system 301 is a system in which the route control unit 130 and the optical multiplexing unit 140 included in the optical transmission device 102 are disposed outside the optical transmission device 102, as the route control device 131 and the optical multiplexing device 141, respectively. A function of the route control device 131 is similar to that of the route control unit 130 and a function of the optical multiplexing device 141 is similar to that of the optical multiplexing unit 140. Therefore, in the second example embodiment, an advantageous effect similar to that of the optical transmission device 102 and the optical transmission system 2 can be achieved even when the optical transmission system 301 is used instead of the optical transmission device 102.

Note that, the example embodiments of the present disclosure can be described as the following supplementary notes, but are not limited thereto.

(Supplementary Note 1)

An optical transmission device including:
   a route control means for outputting user data including destination information to a first channel or a second channel, based on a latency associated with each destination included in the destination information;
   a first optical transmission means for treating the user data as first data when the user data are output to the first channel, converting the first data into a first optical signal by first error correction coding processing and a first modulation method, and transmitting the first optical signal; and
   a second optical transmission means for treating the user data as second data when the user data are output to the second channel, converting the second data into a second optical signal by second error correction coding processing different from the first error correction coding processing, and a second modulation method different from the first modulation method, and transmitting the second optical signal.

(Supplementary Note 2)

The optical transmission device according to supplementary note 1, wherein
   a length of a correction code to be added to the first data in the first error correction coding processing is less than a length of a correction code to be added to the second data in the second error correction coding processing, and
   a transmission rate of the first data modulated with the first modulation method is less than a transmission rate of the second data modulated with the second modulation method.

(Supplementary Note 3)

The optical transmission device according to supplementary note 1 or 2, wherein
   the first optical signal is an optical signal having a first wavelength, and the second optical signal is an optical signal having a second wavelength different from the first wavelength.

(Supplementary Note 4)

The optical transmission device according to supplementary note 3, further including an optical multiplexing means for wavelength-multiplexing the first optical signal and the second optical signal.

(Supplementary Note 5)

The optical transmission device according to any one of supplementary notes 1 to 4, wherein
   the first optical transmission means includes:
      a first framer that performs the first error correction coding processing; and
      a first modulation means for outputting the first optical signal modulated with the first modulation method by using the first data on which the first error correction coding processing is performed, and
   the second optical transmission means includes:
      a second framer that performs the second error correction coding processing; and
      a second modulation means for outputting the second optical signal modulated with the second modulation method by using the second data on which the second error correction coding processing is performed.

(Supplementary Note 6)

The optical transmission device according to supplementary note 5, wherein
   both the first data and the second data are optical signals,
   the first optical transmission means includes a first photoelectric conversion means for converting the first data into an electric signal and outputting the electric signal to the first framer, and
   the second optical transmission means includes a second photoelectric conversion means for converting the second data into an electric signal and outputting the electric signal to the second framer.

(Supplementary Note 7)

An optical transmission system including an optical transmission device and an optical reception device being communicably connected, wherein the optical transmission device includes:
   a route control means for outputting user data including destination information to a first channel or a second channel, based on a latency associated with each destination included in the destination information;
   a first optical transmission means for treating the user data as first data when the user data are output to the first channel, converting the first data into a first optical signal by first error correction coding processing and a first modulation method, and transmitting the first optical signal; and
   a second optical transmission means for treating the user data as second data when the user data are output to the second channel, converting the second data into a second optical signal by second error correction coding processing different from the first error correction coding processing, and a second modulation method different from the first modulation method, and transmitting the second optical signal, and the optical reception device includes:
   a first optical reception means for demodulating the first data from the first optical signal; and
   a second optical reception means for demodulating the second data from the second optical signal.

(Supplementary Note 8)

The optical transmission system according to supplementary note 7, wherein the first optical reception means includes:
   a first demodulation means for converting the first optical signal into a first electric signal; and
   a third framer that performs error correction processing on the first electric signal and outputs the first data, and the second optical reception means includes:
   a second demodulation means for converting the second optical signal into a second electric signal; and
   a fourth framer that performs error correction processing on the second electric signal and outputs the second data.

(Supplementary Note 9)

An optical transmission method including:
   outputting user data including destination information to a first channel or a second channel, based on a latency associated with each destination included in the destination information;
   treating the user data as first data when the user data are output to the first channel, converting the first data into a first optical signal by first error correction coding processing and a first modulation method, and transmitting the first optical signal; and
   treating the user data as second data when the user data are output to the second channel, converting the second data into a second optical signal by second error correction coding processing different from the first error correction coding processing, and a second modulation method different from the first modulation method, and transmitting the second optical signal.

(Supplementary Note 10)

The optical transmission method according to supplementary note 9, wherein
   a length of a correction code to be added to the first data in the first error correction coding processing is less than a length of a correction code to be added to the second data in the second error correction coding processing, and
   a transmission rate of the first data modulated with the first modulation method is less than a transmission rate of the second data modulated with the second modulation method.

(Supplementary Note 11)

The optical transmission method according to supplementary note 9 or 10, wherein the first optical signal has a first wavelength and the second optical signal has a second wavelength different from the first wavelength.

(Supplementary Note 12)

The optical transmission method according to supplementary note 11, further including a step of wavelength-multiplexing the first optical signal and the second optical signal.

(Supplementary Note 13)

A program for an optical transmission device, causing a computer of the optical transmission device to execute:
   a step of outputting user data including destination information to a first channel or a second channel, based on a latency associated with each destination included in the destination information;
   a step of treating the user data as first data when the user data are output to the first channel, converting the first data into a first optical signal by first error correction coding processing and a first modulation means, and transmitting the first optical signal; and
   a step of treating the user data as second data when the user data are output to the second channel, converting the second data into a second optical signal by second error correction coding processing different from the first error correction coding processing, and a second modulation method different from the first modulation method, and transmitting the second optical signal.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims. For example, the present disclosure is applied to an optical submarine cable system or a land-based optical transmission system. Further, the description on the optical transmission device in each example embodiment also discloses an optical transmission system including the optical transmission device and an optical transmission method using the optical transmission device.

The configurations described in each of the example embodiments are not necessarily exclusive to each other. The action and the advantageous effect of the present disclosure may be achieved by a configuration in which all or some of the above-described example embodiments are combined.

The function and the operational procedure of each of the optical transmission devices 100, 101, and 102, the route control unit 130, and the route control device 131 described in the example embodiments may be achieved by a central processing unit (CPU) included in each of the apparatuses executing a program. The program is recorded on a fixed, non-transitory recording medium. A semiconductor memory or a fixed magnetic disk device is used as the recording medium, but the recording medium is not limited thereto.

REFERENCE SIGNS LIST

1, 2 Optical transmission system
100, 101, 102 Optical transmission device 110, 110A First optical transmission unit
111 First framer
112 First modulation unit
113 First photoelectric conversion unit
120, 120A Second optical transmission unit
121 Second framer
122 Second modulation unit
123 Second photoelectric conversion unit
130 Route control unit
131 Route control device
140 Optical multiplexing unit
141 Optical multiplexing device
300, 301 Optical transmission system
500, 501 Optical reception device
510 First optical reception unit
511 First demodulation unit
512 Third framer
520 Second optical reception unit
540 Optical demultiplexing unit
701 User apparatus
711, 721 Network apparatus

The invention claimed is:

1. An optical transmission device comprising:
a route controller configured to output user data including destination information to a first channel or a second channel, based on a latency associated with each destination included in the destination information;
a first optical transmitter configured to treat the user data as first data when the user data are output to the first channel, convert the first data into a first optical signal by first error correction coding processing and a first modulation method, and transmit the first optical signal; and
a second optical transmitter configured to treat the user data as second data when the user data are output to the second channel, convert the second data into a second optical signal by second error correction coding processing different from the first error correction coding processing, and a second modulation method different from the first modulation method, and transmit the second optical signal.

2. The optical transmission device according to claim 1, wherein
a length of a correction code to be added to the first data in the first error correction coding processing is less than a length of a correction code to be added to the second data in the second error correction coding processing, and
a transmission rate of the first data modulated with the first modulation method is less than a transmission rate of the second data modulated with the second modulation method.

3. The optical transmission device according to claim 1, wherein
the first optical signal is an optical signal having a first wavelength, and the second optical signal is an optical signal having a second wavelength different from the first wavelength.

4. The optical transmission device according to claim 3, further comprising an optical multiplexer configured to wavelength-multiplex the first optical signal and the second optical signal.

5. The optical transmission device according to claim 1, wherein
the first optical transmitter includes:
a first framer configured to perform the first error correction coding processing; and
a first modulator configured to output the first optical signal modulated with the first modulation method by using the first data on which the first error correction coding processing is performed, and
the second optical transmitter includes:
a second framer configured to perform the second error correction coding processing; and
a second modulator configured to output the second optical signal modulated with the second modulation method by using the second data on which the second error correction coding processing is performed.

6. The optical transmission device according to claim 5, wherein
both the first data and the second data are optical signals,
the first optical transmitter includes a first photoelectric convertor configured to convert the first data into an electric signal and output the electric signal to the first framer, and
the second optical transmitter includes a second photoelectric convertor configured to convert the second data into an electric signal and output the electric signal to the second framer.

7. An optical transmission system comprising an optical transmission device and an optical reception device being communicably connected, wherein
the optical transmission device includes:
a route controller configured to output user data including destination information to a first channel or a second channel, based on a latency associated with each destination included in the destination information;
a first optical transmitter configured to treat the user data as first data when the user data are output to the first channel, convert the first data into a first optical signal by first error correction coding processing and a first modulation method, and transmit the first optical signal; and
a second optical transmitter configured to treat the user data as second data when the user data are output to the second channel, convert the second data into a second optical signal by second error correction coding processing different from the first error correction coding processing, and a second modulation method different from the first modulation method, and transmit the second optical signal, and
the optical reception device includes:
a first optical receiver configured to demodulate the first data from the first optical signal; and
a second optical receiver configured to demodulate the second data from the second optical signal.

8. The optical transmission system according to claim 7, wherein
the first optical receiver includes:
a first demodulator configured to convert the first optical signal into a first electric signal; and
a third framer configured to perform error correction processing on the first electric signal and output the first data, and
the second optical receiver includes:
a second demodulator configured to convert the second optical signal into a second electric signal; and
a fourth framer configured to perform error correction processing on the second electric signal and output the second data.

9. An optical transmission method comprising:

outputting user data including destination information to a first channel or a second channel, based on a latency associated with each destination included in the destination information;

treating the user data as first data when the user data are output to the first channel, converting the first data into a first optical signal by first error correction coding processing and a first modulation method, and transmitting the first optical signal; and treating the user data as second data when the user data are output to the second channel, converting the second data into a second optical signal by second error correction coding processing different from the first error correction coding processing, and a second modulation method different from the first modulation method, and transmitting the second optical signal.

10. The optical transmission method according to claim 9, wherein a length of a correction code to be added to the first data in the first error correction coding processing is less than a length of a correction code to be added to the second data in the second error correction coding processing, and a transmission rate of the first data modulated with the first modulation method is less than a transmission rate of the second data modulated with the second modulation method.

11. The optical transmission method according to claim 9, wherein the first optical signal has a first wavelength and the second optical signal has a second wavelength different from the first wavelength.

12. The optical transmission method according to claim 11, further comprising a step of wavelength-multiplexing the first optical signal and the second optical signal.

* * * * *